(12) United States Patent
Chen et al.

(10) Patent No.: US 7,248,076 B2
(45) Date of Patent: Jul. 24, 2007

(54) DUAL-VOLTAGE THREE-STATE BUFFER CIRCUIT WITH SIMPLIFIED TRI-STATE LEVEL SHIFTER

(75) Inventors: Kuo-Ji Chen, Taipei County (TW); Ker-Min Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 122 days.

(21) Appl. No.: 11/063,961

(22) Filed: Feb. 23, 2005

(65) Prior Publication Data

US 2006/0186921 A1  Aug. 24, 2006

(51) Int. Cl.
*H03K 19/0175* (2006.01)
(52) U.S. Cl. .............................. 326/83; 326/68; 326/57
(58) Field of Classification Search ............ 326/56–58, 326/63, 68, 82, 83, 86
See application file for complete search history.

(56) References Cited

U.S. PATENT DOCUMENTS 6,262,599 B1 * 7/2001 Coughlin et al. ............. 326/81
2004/0227558 A1 * 11/2004 Hayashi et al. ............. 327/333

* cited by examiner

*Primary Examiner*—Don Le
(74) *Attorney, Agent, or Firm*—Duane Morris LLP

(57) ABSTRACT

A dual-voltage three-state buffer circuit controls a post driver circuit to operate in a three-state mode and includes a tri-state logic control module operated under a low supply voltage, a level shifter for receiving one or more inputs from the tri-state logic control module and operating with an output control circuit for controlling two differential outputs of the level shifter, and a post driver circuit driven by the two differential outputs of the level shifter, wherein the level shifter, the output control circuit, an the post driver circuit are operated under a high supply voltage, and wherein when the tri-state logic control module generates the inputs for putting the post driver circuit in a high impedance state, the output control circuit operates with the level shifter to turn off the PMOS and NMOS transistors of the post driver circuit while isolating the level shifter from a high supply voltage.

19 Claims, 4 Drawing Sheets

DUAL-VOLTAGE THREE-STATE BUFFER CIRCUIT WITH SIMPLIFIED TRI-STATE LEVEL SHIFTER

BACKGROUND

The present invention relates generally to integrated circuits, and more particularly, to an improved design of a dual-voltage three-state buffer circuit using a tri-state level shifter.

A conventional dual-voltage three-state buffer includes two level shifters to control a post driver circuit that is made of PMOS and NMOS transistors. The two level shifters translate lower voltage signals to higher voltage signals. The post driver circuit determines the output of the overall circuit by deciding which transistor is to be turned on or off. However, the time it takes for the PMOS and NMOS transistors to turn on or off is different, since PMOS transistors are usually slower to drive than NMOS transistors. The time required for a signal to output from each of the level shifters may also be different, since different input signals can create different paths for the signals to travel through, wherein some paths may take more time than the others. With all these timing differences, a cross-bar current can occur during the switching of the transistors in the post driver circuit, thereby degrading the performance for the circuit. In order for a conventional dual-voltage three-state buffer to solve such issues, unbalanced inverters are inserted between the level shifter outputs and the transistors of the post driver circuit. While this method reduces the cross-bar current of the post driver circuit, the inverters are extremely unbalanced, consume extra power, and require additional layout areas.

Desirable in the art of dual-voltage buffer designs are designs that provide less power consumption, smaller layout area, and better versatility.

SUMMARY

In view of the foregoing, this invention provides an improved design of a dual-voltage buffer circuit by implementing tri-state level shifter. In one embodiment, it has a tri-state logic control module operated under a low supply voltage, a level shifter for receiving one or more inputs from the tri-state logic control module and operating with an output control circuit for controlling two differential outputs of the level shifter, and a post driver circuit having a PMOS transistor and an NMOS transistor connected in series and driven by the two differential outputs of the level shifter, wherein the level shifter, the output control circuit, an the post driver circuit are operated under a high supply voltage, and wherein when the tri-state logic control module generates the inputs for putting the post driver circuit in a high impedance state, the output control circuit operates with the level shifter to turn off the PMOS and NMOS transistors of the post driver circuit while isolating the level shifter from a high supply voltage.

The construction and method of operation of the invention, however, together with additional objects and advantages thereof will be best understood from the following descriptions of specific embodiments when read in connection with the accompanying figures.

DESCRIPTION

The present invention provides a dual-voltage three-state buffer circuit with a tri-state level shifter that simplifies circuit design. As such, the invention reduces the layout area and power consumption by the dual-voltage circuit.

Figures 1A, 1B:
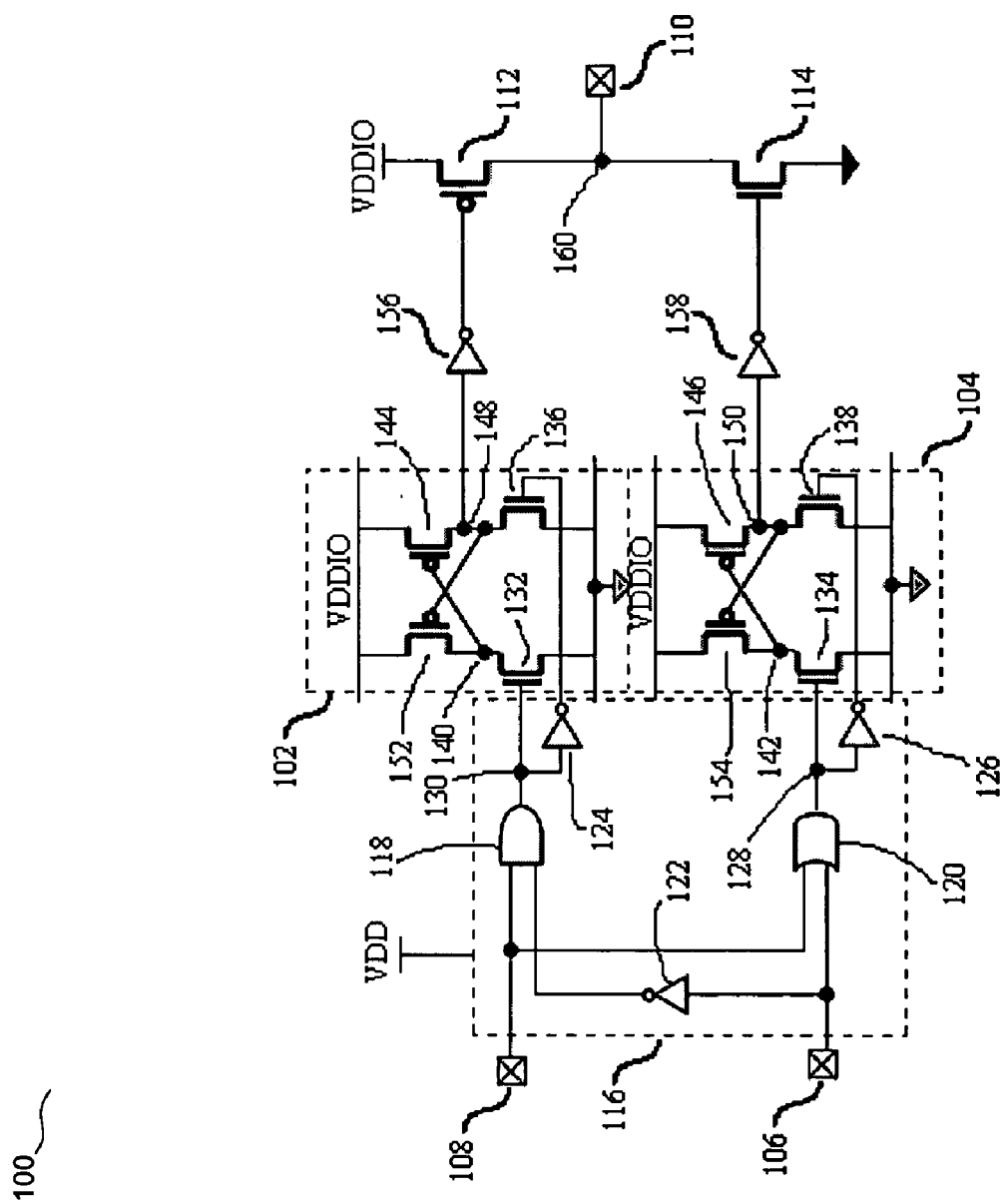
FIG. 1A illustrates a conventional dual-voltage three-state buffer circuit comprised of a decoder with two level shifters.
FIG. 1B presents a truth table of the conventional dual-voltage three-state buffer circuit.

FIG. 1A illustrates a conventional dual-voltage three-state buffer 100 comprised of a decoder with level shifters 102 and 104. The buffer 100 has two modes of operation: normal mode and tri-state mode. These modes of operation are controlled by an enable pin 106 and an input pin 108. The normal mode allows the buffer 100 to output what is inputted from the input pin 108 to a pad 110, if the enable pin 106 is set low. Tri-state mode's function is to turn off a post driver PMOS transistor 112 and a post driver NMOS transistor 114 to create high impedance at the output of the buffer 100.

For this example, the enable pin 106 is expected to be low and the input pin 108 is expected to be high to illustrate the operation of the normal mode of the buffer 100. A control logic block 116 in the buffer 100 is powered by a low voltage source VDD and is made up of an AND gate 118, an OR gate 120, and three inverters 122, 124 and 126. The components within the control logic block 116 work together to provide the correct input signal for the level shifters 102 and 104. The OR gate 120 takes in the high signal from the input pin 108 and the low signal from the enable pin 106 to provide a high signal for a node 128. The AND gate 118 takes in the high signal from the input pin 108 and the high inverted enable signal from the inverter 122 to provide a node 130 with a high signal. The high signals from the nodes 128 and 130 then turn on NMOS transistors 134 and 132, while the low signals at the gates of NMOS transistors 136 and 138 caused by the inverters 124 and 126 turn off the NMOS transistors 136 and 138. With both NMOS transistors 132 and 134 turned on, nodes 140 and 142 are both pulled to low, and in return provide the gates of PMOS transistors 144 and 146 with low signals. The PMOS transistors 144 and 146 will turn on and pull the nodes 148 and 150 high due to the source voltage VDDIO. The high signal at the nodes 148 and 150 will turn off the PMOS transistors 152 and 154 and also be inverted to low signals before reaching the post driver transistors 112 and 114 by going through inverters 156 and 158. The low signals at the gates of the transistors will turn the transistor 112 on and the transistor 114 off. This allows a node 160 to be pulled high by source voltage VDDIO, thereby giving a high output signal at the pad 110.

To show how the circuit 100 operates during tri-state mode, both the enable pin 106 and the input pin 108 are now set to high. The two signals will first go through the control logic block 116. In the control logic block 116, the AND gate 118 takes in a low inverted enable signal from the inverter 122 and a high signal from the input pin 108 to give the node 130 a low signal. Similarly, the OR gate 120 takes in a high signal from the input pin 108 and the enable pin 106 to provide the node 128 with a high signal. The low signal at the node 130 will turn the NMOS transistor 132 off and the NMOS transistor 136 on after going through the inverter 124. The high signal at the node 128 turns the NMOS transistor 134 on and the NMOS transistor 138 off after going through the inverter 126. As a result, nodes 148 and 142 are pulled to low, thereby turning the PMOS transistors 152 and 146 on. The nodes 140 and 150 are pulled high by the source voltage VDDIO since the PMOS transistors 152 and 146 are turned on. The two high state nodes 140 and 150 help turn off the PMOS transistors 144 and 154. With the node 148 pulled to low and the node 150 pulled to high, both signals are inverted after going through the inverters 156 and 158. The output of the inverter 156 provides the gate of the transistor 112 with a high signal, thereby turning the transistor 112 off. The inverter 158 outputs a low signal for the gate of the transistor 114, thereby turning the transistor 114 off. With both transistors 112 and 114 turned off, the circuit enters tri-state, and both the node 160 and the PAD 110 will have high impedance.

FIG. 1B presents a truth table 162 of the conventional dual-voltage three-state buffer 100. The truth table 162 shows the expected output signals for all three possible states with different combinations of enable or input signals.

While the buffer 100 reduces post driver cross-bar current and translates lower voltage to higher voltage with the use of two level shifters 102 and 104, the inverter ratio that drives the gates of post driver transistors 112 and 114 are extremely un-balanced because of the timing issues. Furthermore, the level shifters 102, 104 and inverters 156, 158 increase the power consumption and layout area. This invites an improved design of the dual-voltage three-state buffer.

Figures 2A, 2B:
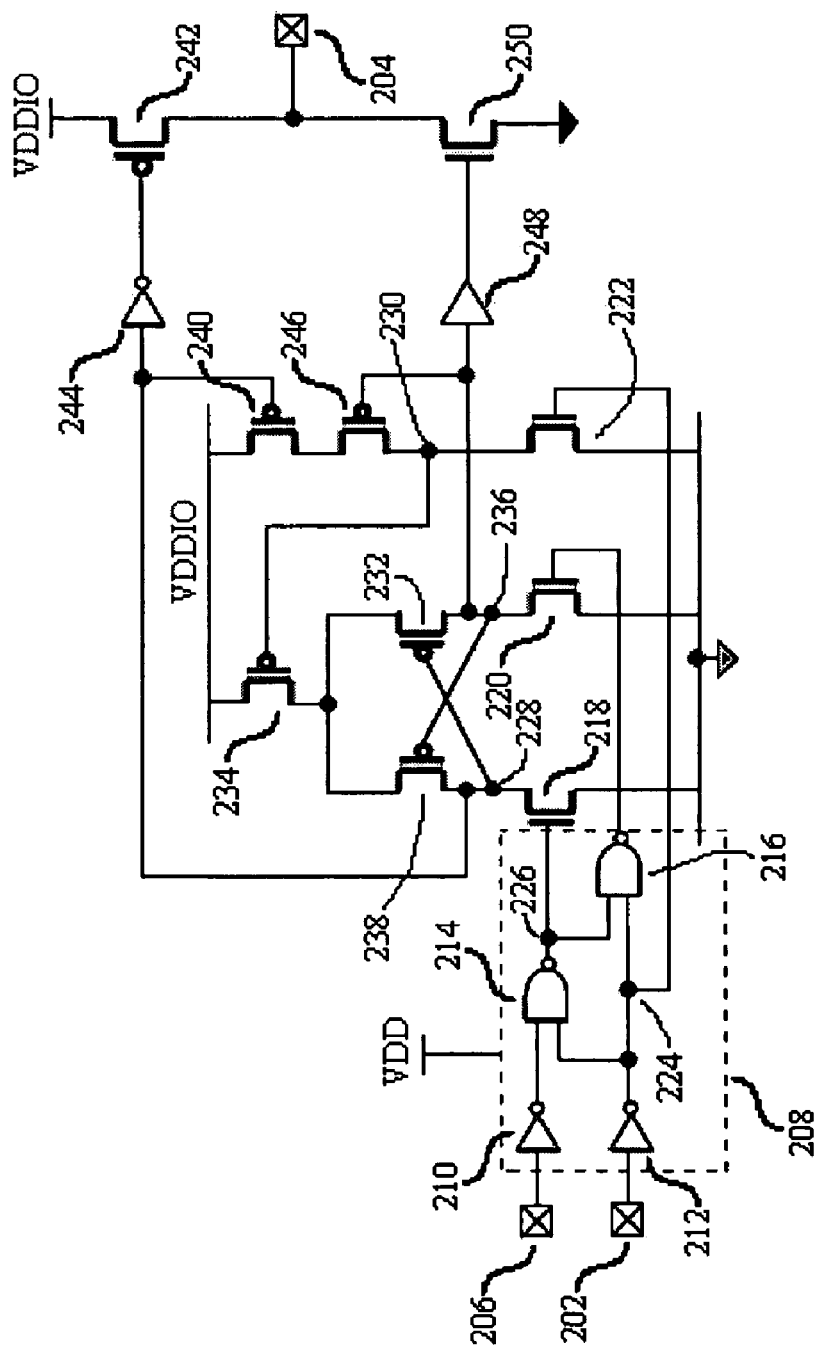
FIG. 2A illustrates a dual-voltage three-state buffer circuit in accordance with a first embodiment of the present invention.
FIG. 2B presents a truth table of the dual-voltage three-state buffer circuit in accordance with the first embodiment of the present invention.

FIG. 2A illustrates a dual-voltage three-state buffer circuit 200 in accordance with the first embodiment of the present invention. The circuit 200 includes only one level shifter and a plurality of pull-up and pull-down switches.

Like the buffer 100, the circuit 200 also switches between three different states with two modes of operation: normal mode and tri-state mode. Normal mode occurs when an enable pin 202 is set to low, and allows a PAD 204 to output the inverse signal of what was inputted into an input pin 206. In order to activate the tri-state mode, the enable pin 202 will be set to high by an output enable signal. Regardless of the state of the input signal, the PAD 204 will have a high impedance. The circuit 200 essentially serves to translate lower voltage signals to higher voltage signals with the help of a tri-state level shifter. Only a tri-state logic control module 208 and other components before it are supplied by a lower voltage source VDD. All other components within the circuit 200 are powered by a higher voltage power supply VDDIO.

A three state level shifter, which is collectively represented by PMOS transistors 232, 238 and NMOS transistors 218, 220, is connected between a high voltage output switch such as a PMOS transistor 234 and ground. A high voltage output control circuit, which may include the PMOS transistor 234, 240, 246, and NMOS transistor 222 are powered by the high voltage power supply. The NMOS transistor 222 is connected to the gate of the PMOS transistor 234 on one end and the ground on the other with its gate controlled by node 224. The level shifter is connected to a post driver circuit, which includes a PMOS transistor 242 and a NMOS transistor 250, via an inverter 244 and a buffer 248. The gate of the PMOS transistor 240 is further connected to the inverter 244, and the gate of the PMOS transistor 246 is further connected to the buffer 248. It is noted that the transistor 240 and 246 are connected in series, with the gate of the transistor 240 connected to the input of the inverter 244, and with the gate of the transistor 246 tied to the input of the buffer 248. As such, the high voltage output control circuit affects how signals travel from the differential outputs, i.e., nodes 228 and 236, of the level shifter to the post driver circuit.

To illustrate how normal mode operates, a low signal is inputted into the enable pin 202 and a high signal is inputted into the input pin 206. The two signals first go through the tri-state logic control module 208 that is powered by a low voltage source VDD. The tri-state logic control module 208 is made of several logic components: inverters 210 and 212, and NAND gates 214 and 216. These components work together to determine which of the pull-down transistors 218, 220, and 222 are to be turned on or turned off. A node 224 simply has a high inverted signal of what is inputted to the enable pin 202. This high signal at the node 224 will turn on the transistor 222. A node 226 controls the switching of the transistor 218 and it has a high signal since the NAND gate 214 takes in the high signal from the node 224 and the low inverted signal of the input pin 206 from the inverter 210. The high signal of the node 226 also turns on the transistor 218. With both signals at the nodes 224 and 226 high, the NAND gate 216 provides the gate of the transistor 220 with a low signal, thereby turning it off. Since the transistors 218 and 222 are both turned on, the two differential output nodes 228 and 230 are both pulled low, thereby turning on the PMOS transistor 232 and a pull-up PMOS transistor 234. This provides a straight path from source voltage VDDIO to a node 236, thereby pulling it high. This in return also turns off the PMOS transistor 238. With the node 228 pulled down, the PMOS transistor 240 is turned on. Since the gate of the post driver PMOS transistor 242 will have a high signal because of the inverter 244, the transistor 242 will be turned off. The high signal at the node 236 turns off the PMOS transistor 246 and continues through a buffer 248 to turn on the post driver NMOS transistor 250. Since the transistor 242 is turned off and the transistor 250 is turned on, the signal at the PAD 204 will be pulled low, which is the inverse of the input at the input pin 206.

The tri-state mode can be activated by a high output enable signal at the enable pin 202, thereby creating a high impedance to the output at the PAD 204, regardless of the input signal at the input pin 206. To show how the tri-state mode operates, both the enable pin 202 and the input pin 206 will be set to high. The operation begins by having the two signals enter the tri-state logic control block 208 to determine which of the pull-down switches are to be turned on or off. Because of the inverter 212, the node 224 will have a low signal, which turns the transistor 222 off. The NAND gate 214 provides the node 226 with a high signal, after taking in the two low signals from the inverters 210 and 212. The node 226 with a high signal turns on the transistor 218. The NAND gate 216 takes in the high signal at the node 226 and the low signal at the node 224, thereby providing a high signal to the gate of the transistor 220 and turning the transistor 220 on. This immediately pulls both the nodes 228 and 236 low and then turning the transistors 240 and 246 on. The gate of the switch/PMOS transistor 234 will be pulled high from the direct path connected to source voltage VDDIO. This helps to shut off high voltage power from the entire level shifter. The transistor 242 is turned off, after the low signal at the node 228 goes through the inverter 244. The transistor 250 will also turn off since the low signal from the node 236 continues through the buffer 248. With both transistors 242 and 250 turned off, the PAD 204 will have a very high impedance.

FIG. 2B presents a truth table 252 in accordance with the first embodiment of the present invention. The truth table 252 shows the expected output signals for all three possible states with different combinations of enable or input signals.

Figures 3A, 3B:
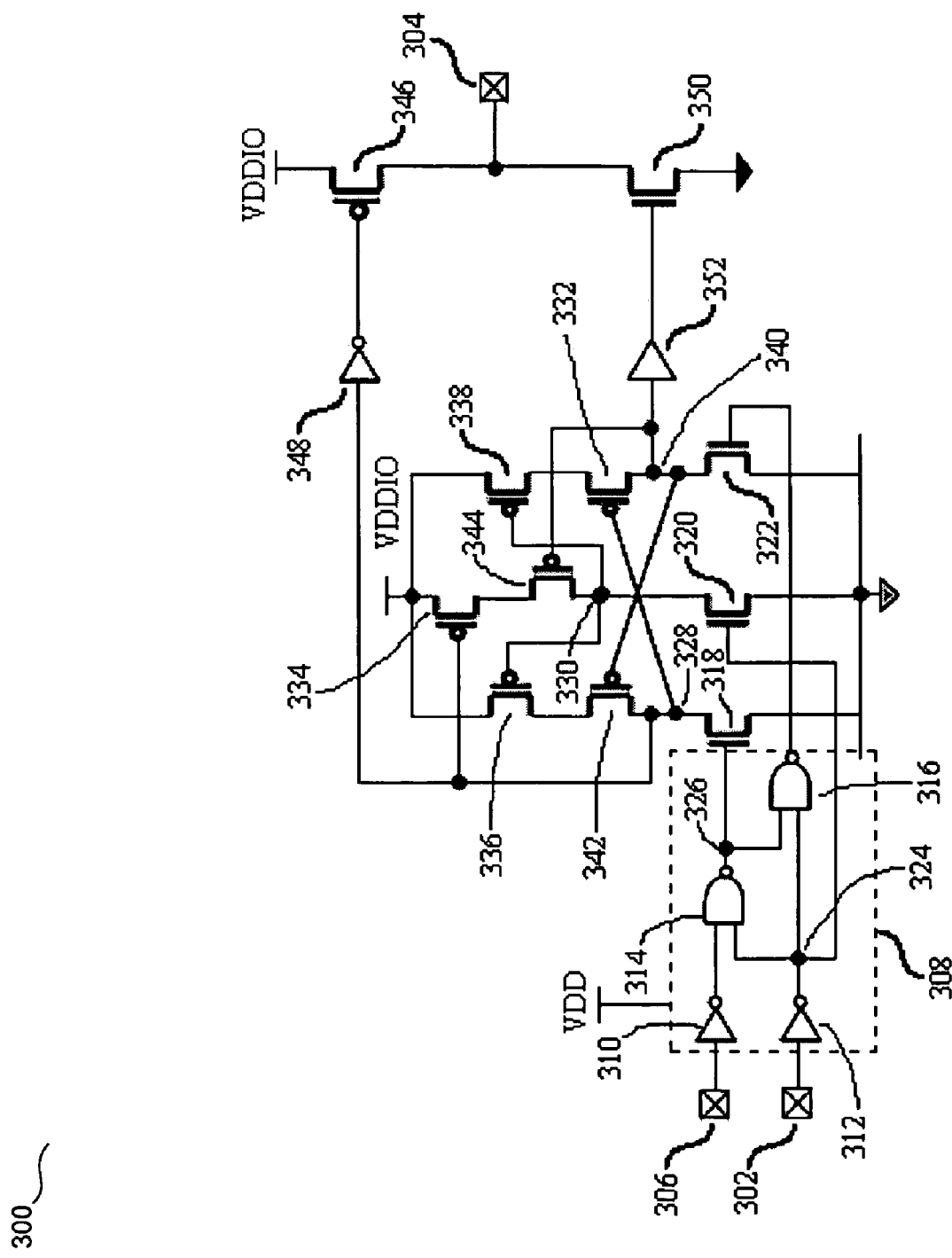
FIG. 3A illustrates a dual-voltage three-state buffer circuit in accordance with a second embodiment of the present invention.
FIG. 3B presents a truth table of the dual-voltage three-state buffer circuit in accordance with the second embodiment of the present invention.

FIG. 3A illustrates a dual-voltage three-state buffer circuit 300 in accordance with the second embodiment of the present invention. The buffer circuit 300 has only one level shifter and several pull-up and pull-down switches.

Similar to the buffer 200, the buffer 300 also switches between three different states with two modes of operation: normal mode and tri-state mode. Normal mode occurs when an enable pin 302 is set to low and it allows a PAD 304 to output the inverse signal of what is inputted into an input pin 306. In order to activate the tri-state mode, the enable pin 302 will be set to high by an output enable signal. Regardless of the state of the input signal, the PAD 304 will have a high impedance. The dual-voltage three-state buffer circuit 300 also provides a function to translate lower voltage signals to higher voltage signals with the help of the tri-state level shifter. Only a tri-state logic control module 308 and other components before it are supplied by a lower source voltage VDD. All other components within the buffer 300 are powered by a higher source voltage VDDIO.

PMOS transistors 336, 338, collectively representing a high voltage output switch, are connected in parallel between a high voltage power supply and a level shifter. The level shifter, which is collectively represented by PMOS transistors 332, 342 and NMOS transistors 318, 322, is connected between the PMOS transistors 336, 338 and ground. An output control circuit, which is collectively represented by PMOS transistors 334, 330, NMOS transistor 320, and output switches such as the PMOS transistors 336, 338, asserts controls over the differential outputs 328 and 340 of the level shifter. The NMOS transistor 320 is connected to the gate of the PMOS transistors 336, 338. The level shifter is connected to a post driver circuit, which includes a PMOS transistor 346 and a NMOS transistor 350, via an inverter 348 and a buffer 352, respectively. The gate of the PMOS transistor 340 is further connected to the inverter 348, and the gate of the PMOS transistor 344 is further connected to the buffer 352.

To illustrate how the normal mode of the buffer 300 operates, the enable pin 302 is set to low and the input pin 306 is set to high. The signals first arrive at the tri-state logic control block 308. The tri-state logic control block 308 has the same function as the tri-state logic control block 208 used in the first embodiment as illustrated in FIG. 2A. The inverters 310 and 312, and the NAND gates 314 and 316 works together in the tri-state logic control block 308 to provide commands for pull-down switches NMOS transistors 318, 320 and 322. The low signal at the enable pin 302 is inverted by the inverter 312, thereby giving a node 324 a high signal, which then turns on the transistor 320. The NAND gate 314 takes in the high signal at the node 324 and the low inverted input signal from the inverter 310 to provide a node 326 with a high signal. This in return also turns on the transistor 318. The NAND gate 316 takes in the two high signals from the nodes 326 and 324 to give the gate of the transistor 322 a low signal, thereby turning it off. With both the transistors 318 and 320 switched on, nodes 328 and 330 are both pulled to low, thereby turning on PMOS transistors 332, 334, 336 and 338. When the transistors 332 and 338 are turned on, they provide a path for source voltage VDDIO to pull a node 340 to high. The high signal at the node 340 in effect will turn off the PMOS transistors 342 and 344. With a low signal at the node 328, when the gate of a post driver PMOS transistor 346 receives a high signal because of an inverter 348, the transistor 346 will be turned off. A NMOS transistor 350 will be turned on since the high signal at the node 340 simply continues through a buffer 352. When the transistor 350 is turned on, it helps pull the signal at the PAD 304 to low. As such, the output signal of the buffer 300 becomes the inverse of the input signal.

The tri-state mode occurs when the enable pin 302 is set to a high state. The input pin is also set to high, thereby helping to show how the buffer 300 operates in tri-state mode. Once again, the signals enter the low voltage tri-state logic control block 308 to determine when pull-down switches are to be opened or closed. The node 324 will carry a low signal since the inverter 312 inverts the high enable signal from the enable pin 302, and this low signal also turns off the transistor 320. The NAND gate 314 will take in the low signals from the node 324 and the inverter 310 to provide the node 326 with a high signal, thereby turning the transistor 318 on. The NAND gate 316 also takes in a high signal at the node 326 and a low signal at the node 324, thereby giving the gate of the transistor 322 a high signal and turning the transistor 322 on. With the transistors 318 and 322 turned on, the nodes 328 and 340 are quickly pulled to low, thereby turning on the transistors 334 and 344 and allowing a high signal from the source voltage VDDIO to reach the gates of transistors 336 and 338. This turns off both the transistors 336 and 338, thereby shutting off power from the level shifter. The low signal at the node 328 turns the transistor 346 off after the signal goes through the inverter 348, while the low signal at the node 340 turns the transistor 350 off after the low signal continues through the buffer 352. With transistors 346 and 350 turned off, the output at the PAD 304 will have a high impedance.

FIG. 3B presents a truth table 354 in accordance with the second embodiment of the present invention. The truth table 354 shows the expected output signals for all three possible states with different combinations of enable or input signals.

Figure 4:
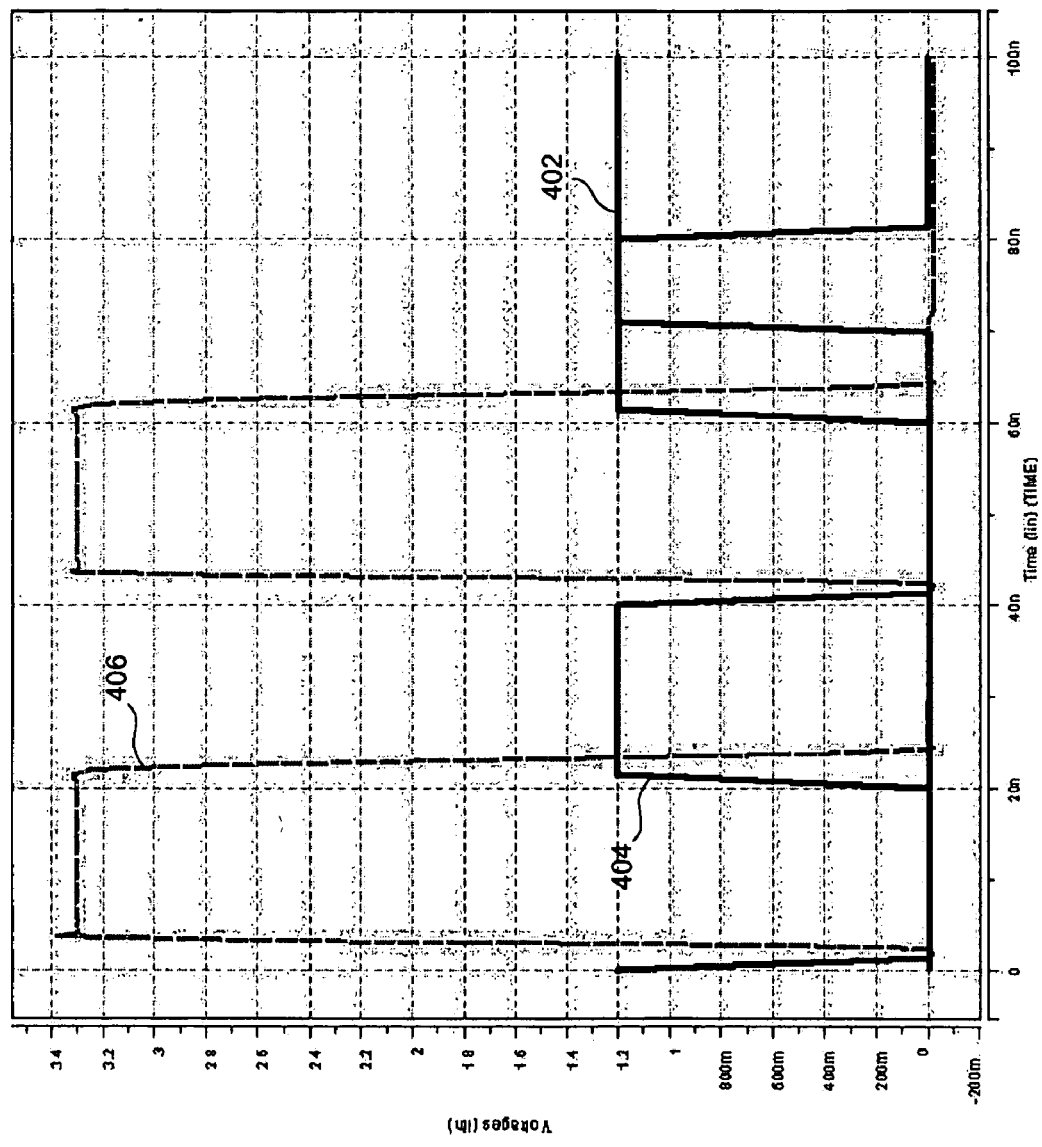
FIG. 4 presents a diagram illustrating the relationship of various signals in accordance with the first embodiment of the present invention.

FIG. 4 presents a diagram 400 illustrating the relationship between output and input signals in accordance with the first embodiment of the present invention. With reference to FIGS. 2A and 4, the relationship is essentially between the output signal from the PAD 204 when the input signal of the input pin 206, as well as the enable signal of the enable pin 202 from the first embodiment are being changed.

A curve 402 is the enable signal; it will remain at low state until 70 ns into the plot. A curve 404 shows the changes of the input signal. In this embodiment, the state of input signal is being changed around every 20 ns. The high state of the input signal is 1.2 volts, and low state is 0 volts. With reference to FIGS. 2A and 4, this low voltage results from the input signal entering the buffer 200 before going through a level shifter. A curve 406 shows the response of the output signal during the changes of the curve 402 (enable signal) and the curve 404 (input signal). During the first 70 ns, the enable signal has no affect on the response of the output signal. Whenever the input signal is at a low state, the output signal would be at high and vice versa. The high state for the output signal is around 3.3 volts and the low state is 0 volts since all components after the tri-state control logic block 208 in FIG. 2A are supplied by the higher voltage source. As mentioned in the description of FIG. 2A, the input signal and output signal are inverse of each other if the enable signal is at a low state. However, when the enable signal turns high at 70 ns, the output signal drops out of existence since no signal can exit through the PAD 204. The input signal can still be changed and would not affect the output signal.

This invention provides a solution to the cross-bar current issue while reducing the switching power and the pre-driver layout area by implementing a single tri-state level shifter. This invention features only one level shifter and some extra pull-up and pull-down switches. The differential outputs 228 and 230 of the level shifter control a pair of transistors 242, 250 in the post driver circuit to determine the output signals. Such differential output of the level shifter provides a self-generated time differential to prevent cross-bar current from occurring during switching.

This invention saves switching power and pre-driver layout area by removing an entire level shifter and a plurality of timing balancing inverters. As a result, the post-driver switching power can be reduced by about 50 percent. Moreover, the proposed dual-voltage three-state buffer circuit is compatible with all existing technologies.

The above illustration provides many different embodiments or examples for implementing different features of the new designs of the dual-voltage three-state buffer circuit. Specific examples of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A dual-voltage three-state buffer circuit comprising:
   a tri-state logic control module operated under a low supply voltage;
   a level shifter for receiving one or more inputs from the tri-state logic control module and operating with an output control circuit for controlling two differential outputs of the level shifter; and
   a post driver circuit having a PMOS transistor and an NMOS transistor connected in series and driven by the two differential outputs of the level shifter,
   wherein the level shifter, the output control circuit, an the post driver circuit are operated under a high supply voltage, and
   wherein when the tri-state logic control module generates the inputs for putting the post driver circuit in a high impedance state, the output control circuit operates with the level shifter to turn off the PMOS and NMOS transistors of the post driver circuit while isolating the level shifter from a high supply voltage.

2. The dual-voltage three-state buffer circuit of claim 1 wherein the output control circuit further includes at least one high voltage output switch coupled between the high supply voltage and the level shifter.

3. The dual-voltage three-state buffer circuit of claim 2 wherein the output control circuit further includes two PMOS transistors coupled in series with each gate controlled by one of the differential outputs of the level shifter.

4. The dual-voltage three-state buffer circuit of claim 3 wherein the output switch is a PMOS transistor and is turned off when the post driver circuit is in the high impedance state for isolating the level shifter.

5. The dual-voltage three-state buffer circuit of claim 3 wherein the output control circuit further comprises an NMOS transistor connected to the two PMOS transistors with its drain connected to the output switch and its gate controlled by the tri-state logic control module.

6. The dual-voltage three-state buffer circuit of claim 5 wherein the tri-state logic control module receives a data Input and a tri-state enable signal wherein when the tri-state enable signal is not asserted, the data input is elevated to a high voltage output by the post driver circuit and wherein when the tri-state enable signal is asserted, the output of the post driver circuit is in the high impedance state.

7. The dual-voltage three-state buffer circuit of claim 6 wherein the tri-state logic control module has a first NAND gate receiving an inverted data input and an inverted tri-state enable signal to generate a first input to the level shifter and a second NAND gate receiving an inverted tri-state enable signal and an output of the first NAND gate to generate a second input to the level shifter.

8. The dual-voltage three-state buffer circuit of claim 2 wherein the output control circuit further includes two PMOS transistors for the output switch coupled in parallel between the high supply voltage and the level shifter.

9. A dual-voltage three-state buffer circuit comprising:
   a tri-state logic control module operated under a low supply voltage and receiving a data input and a tri-state enable signal;
   a single level shifter for receiving one or more inputs from the tri-state logic control module and operating with an output control circuit for controlling a first and a second differential outputs of the level shifter; and
   a post driver circuit having a PMOS transistor and an NMOS transistor connected in series with the gates of PMOS and NMOS transistors driven by the first differential outputs of the level shifter respectively,
   wherein when the tri-state enable signal is not asserted, the data input is elevated to a high voltage output by the post driver circuit,
   wherein when the tri-state enable signal is asserted, the output control circuit operates with the level shifter to turn off the PMOS and NMOS transistors of the post driver circuit while isolating the level shifter from a high supply voltage in response to the inputs generated by the tri-state logic control module.

10. The dual-voltage three-state buffer circuit of claim 9 wherein the output control circuit further includes at least one high voltage output switch coupled between a high supply voltage and the level shifter.

11. The dual-voltage three-state buffer circuit of claim 10 wherein the output control circuit further includes two PMOS transistors coupled in series with each gate controlled by one of the differential outputs of the level shifter.

12. The dual-voltage three-state buffer circuit of claim 11 wherein the output switch is a PMOS transistor and is turned off when the post driver circuit is in the high impedance state for isolating the level shifter.

13. The dual-voltage three-state buffer circuit of claim 12 wherein the output control circuit further comprises an NMOS transistor connected to the two PMOS transistors with its drain connected to the output switch and its gate controlled by the tri-state logic control module.

14. The dual-voltage three-state buffer circuit of claim 9 wherein the tri-state logic control module has a first NAND gate receiving an inverted data input and an inverted tri-state enable signal to generate a first input to the level shifter and a second NAND gate receiving an inverted tri-state enable signal and an output of the first NAND gate to generate a second input to the level shifter.

15. The dual-voltage three-state buffer circuit of claim 9 wherein the output control circuit further includes two PMOS transistors for the output switch coupled in parallel between the high supply voltage and the level shifter.

16. The dual-voltage three-state buffer circuit of claim 10 further comprising an inverter connected between a first differential output of the level shifter and a gate of the PMOS transistor of the post driver circuit and a buffer between a second differential output of the level shifter and a gate of the NMOS transistor of the post driver circuit.

17. A three state level-shifter module adapted to control a post driver circuit having a PMOS transistor and an NMOS transistor connected in series between a high voltage and a low voltage, comprising:
  a single level shifter for receiving one or more inputs; and
  an output control circuit coupled with the single level shifter for controlling the single level shifter to output at least two differential outputs in response to the inputs,
  whereby the single level shifter is capable of controlling gates of the PMOS and NMOS transistors to provide three-state outputs and the output control circuit further includes at least one high voltage output switch coupled between a voltage supply and the single level shifter.

18. The three state level-shifter module of claim 17 wherein the output control circuit further includes two PMOS transistors coupled in series with each gate controlled by one of the differential outputs of the single level shifter and the output switch is a PMOS transistor and is turned off when the post driver circuit is in the high impedance state for isolating the single level shifter.

19. The three state level-shifter module of claim 17 wherein the output control circuit further includes two PMOS transistors coupled in series with each gate controlled by one of the differential outputs of the single level shifter and an NMOS transistor connected to the two PMOS transistors with its drain connected to the output switch.

* * * * *